United States Patent [19]
Kreifels et al.

[11] Patent Number: 5,410,544
[45] Date of Patent: Apr. 25, 1995

[54] EXTERNAL TESTER CONTROL FOR FLASH MEMORY

[75] Inventors: Jerry A. Kreifels, El Dorado Hills; Mamun Rashid, Fairfield; Rodney R. Rozman, Placerville; Richard J. Durante, Citrus Heights, all of Calif.

[73] Assignee: Intel Corporation, Santa Clara, Calif.

[21] Appl. No.: 85,641

[22] Filed: Jun. 30, 1993

[51] Int. Cl.6 ............................................. G06F 11/00
[52] U.S. Cl. ..................................... 371/18; 371/22.5; 365/900; 364/240.7
[58] Field of Search ......................... 371/15.1, 18-22.1, 371/16.1, 27, 22.5; 365/900; 364/491, 238.4, 238.1, 280.7, 244.2, 926.92, 927.9

[56] References Cited

U.S. PATENT DOCUMENTS

| | | | |
|---|---|---|---|
| 4,495,567 | 1/1985 | Treen | 364/200 |
| 4,969,148 | 11/1990 | Nadeau-Dostie et al. | 371/21.1 |
| 5,016,212 | 5/1991 | Yamaguchi et al. | 364/238.4 |
| 5,212,776 | 5/1993 | Zandveld et al. | 364/238.4 |
| 5,245,572 | 9/1993 | Kosonocky et al. | 365/189.02 |
| 5,297,148 | 5/1994 | Harari et al. | 371/10.2 |

*Primary Examiner*—Emanuel T. Voeltz
*Assistant Examiner*—Craig Steven Miller
*Attorney, Agent, or Firm*—Blakely, Sokoloff Taylor & Zafman

[57] ABSTRACT

An apparatus for testing a unit comprising an internal processor coupled to a register by an internal bus. The internal processor is programmed so that it can execute an algorithm. When executed, the algorithm performs an operation on the unit. The register is for storing a state datum. The internal bus is used by the internal processor to access the state datum when the internal processor is executing the algorithm. The testing apparatus comprises an external processor disposed external to the unit and an interface and switch disposed on the unit. The interface is coupled to the internal and external processors and is for receiving a plurality of commands from the external processor. The commands include an internal processor command and an open trap command. If issued, the internal processor command causes the internal processor to execute the algorithm. The switch is coupled to the interface and coupled between the internal processor and the internal bus. If the interface receives the open trap command, the switch permits the external processor to access the state datum of the register.

34 Claims, 3 Drawing Sheets

EXTERNAL TESTER CONTROL FOR FLASH MEMORY

FIELD OF THE INVENTION

The present invention pertains to the field of flash memory. More particularly, this invention relates to providing external tester control for flash memory that has an internal processor.

BACKGROUND OF THE INVENTION

Although it is a relatively new technology, flash memory is well known and readily available. Flash memory is a non-volatile form of random access memory that has a relatively fast access time when it is read. In order to attain its nonvolatility, however, writing to flash memory is a relative slow process. This is because whenever flash memory must be written to, or cleared, a lengthy series of write cycles must be performed in order to ensure that the data to be written to the flash memory has been stored, or to ensure that data formerly stored in the area to be cleared has been erased.

Control of the writing and clearing functions has been performed by dedicated logic of a flash memory integrated circuit unit. During development of the integrated circuit unit, errors in the design of the dedicated logic are detected and must be corrected. Furthermore, over time, requirements regarding modes of operation of the dedicated logic of the integrated circuit unit can change. Modifying the dedicated logic to fix errors or meet new requirements is an expensive and time consuming process. In the worst case, an entirely new integrated circuit unit must be built to modify the dedicated logic.

SUMMARY OF THE INVENTION

One objective of the present invention is to provide a method and apparatus to permit external tester control of a flash memory unit that has an internal processor and associated control registers for implementing internal chip functions.

Another objective of the present invention is to provide a method and apparatus for sharing an algorithm bus of an internal processor when accessing control registers to perform external tester control of a flash memory unit that has an internal processor and associated control registers for implementing internal chip functions.

Another objective of the present invention is to provide a method and apparatus for returning control of the shared test and algorithm bus to an internal processor after performing external tester control of a flash memory unit that has an internal processor and associated control registers for implementing internal chip functions.

Another objective of the present invention is to provide a method and apparatus to permit external tester control of any unit that has an internal processor and associated control registers for implementing internal chip functions.

These and other objects of the invention are provided for by a method and apparatus for testing a unit comprising an internal processor coupled to a register by an internal bus. The internal processor is programmed so that it can execute an algorithm. If executed, the algorithm performs an operation on the unit. The register is for storing a state datum. The internal bus is used by the internal processor to access the state datum when the internal processor is executing the algorithm.

The testing apparatus comprises an external processor disposed external to the unit and an interface and switch disposed on the unit. The interface is coupled to the internal and external processors and to the above-mentioned switch. The interface is for receiving a plurality of commands from the external processor. The commands include an internal processor command and an open trap command. If issued, the internal processor command causes the internal processor to execute the algorithm. The switch is coupled between the internal processor and the internal bus. If the interface receives the open trap command, the switch permits the external processor to access the state datum of the register.

Other objects, features, and advantages of the present invention will be apparent from the accompanying drawings and from the detailed description which follows below.

BRIEF DESCRIPTION OF THE DRAWINGS

The present invention is illustrated by way of example and not limitation in the figures of the accompanying drawings in which like references indicate similar elements, and in which.

DETAILED DESCRIPTION

An architecture and circuitry is disclosed for implementing external tester control in a flash memory unit that has an internal processor and associated control registers for implementing internal chip functions.

Figure 1:
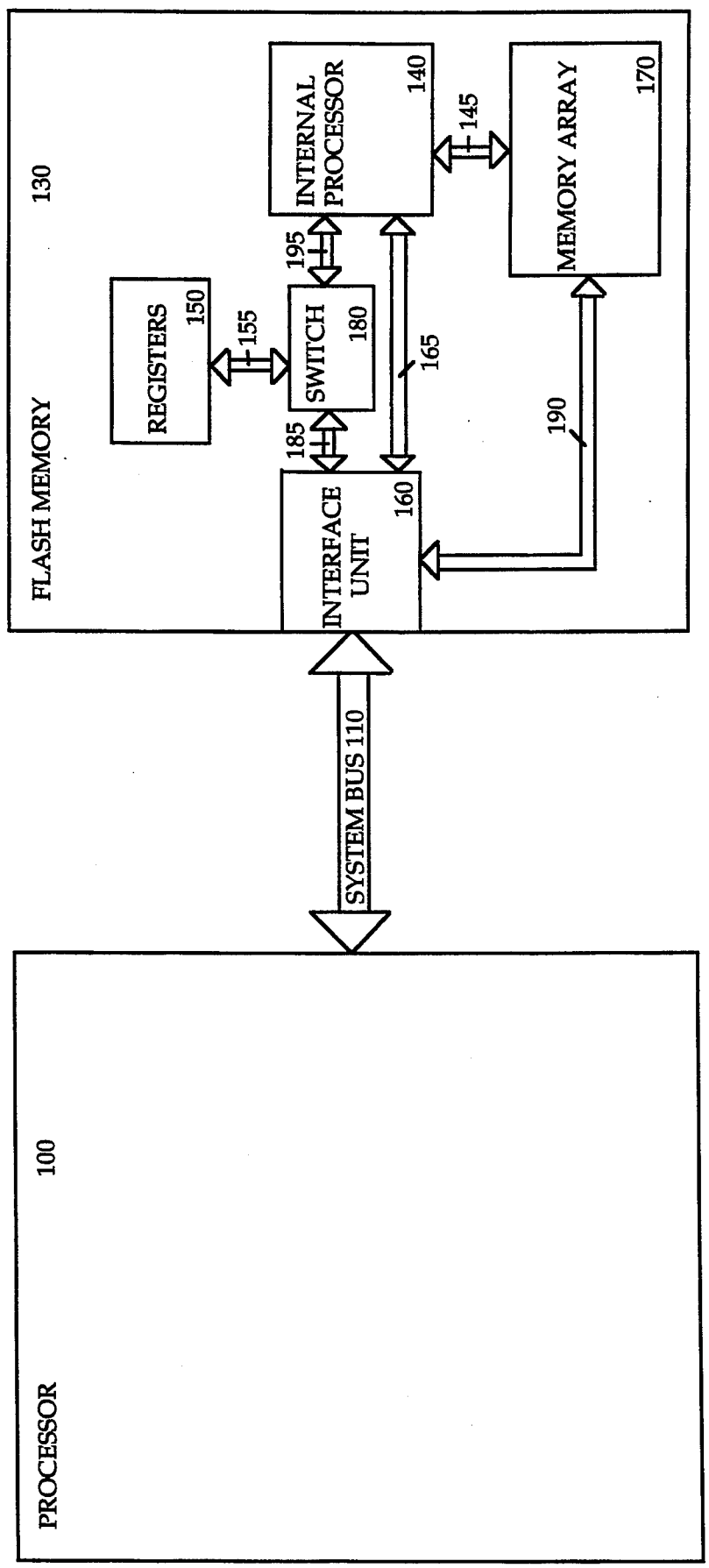
FIG. 1 illustrates a system that includes a flash memory unit that may be controlled externally using the teachings of the present invention.

FIG. 1 depicts one embodiment of a system for providing external control to a flash memory unit that has an internal processor. In FIG. 1, processor 100 is coupled to flash memory 130 by system bus 110. Processor 100 can be a dedicated processor designed specifically for testing flash memory 130. Alternately, processor 100 may be a general purpose processor that can be programmed to provide signals through system bus 110 and thereby externally control and test flash memory 130. During normal operation of flash memory 130, various signals representing commands for flash memory 130, data to be written to, or read from, flash memory array 170 and addresses within the memory array 170 are carried between processor 100 and flash memory 130 over system bus 110.

The command, address and data signals of system bus 110 enter and leave flash memory 130 through interface unit 160. In one embodiment, interface unit 160 interprets an eight bit command. Because the command is comprised of eight bits, up to 256 commands may be issued to interface unit 160. These commands provide a method for processor 100 to control the normal functionality of flash memory 130. Included in the commands is an ability to order internal processor 140 to execute any one a plurality of algorithms that have been stored within internal processor 140. Examples of algorithms that might be stored in internal processor 140 include algorithms to control the write cycles or erase cycles of memory array 170. Examples of commands that may be sent to interface unit 160 include commands to read status or to read the memory array.

Interface unit 160 is coupled to internal processor 140 by bus 165. It is over bus 165 that interface unit 160 issues commands that cause internal processor 140 to execute one of the algorithms stored within internal processor 140. Internal processor 140, in turn, is coupled to memory array 170 by bus 145. Bus 145 permits internal processor 140 to access memory array 170 as it is executing an algorithm. Interface unit 160 is also coupled to memory array 170 by bus 190. Bus 190 permits interface unit 160 to have direct access to memory array 170.

As an algorithm executes in internal processor 140, registers 150 are set and reset by internal processor 140. Setting a register of registers 150 causes a particular hardware event to occur within the flash memory 130. Internal processor 140 could be coupled directly to registers 150 by a bus. In one embodiment, however, processor 140 is not coupled directly to registers 150. Instead, in the embodiment, internal processor 140 is coupled to switch 180 by bus 195. Registers 150 and interface unit 160 are also coupled to switch 180 by buses 155 and 185, respectively.

As will be explained below in greater detail, buses 155, 185 and 195 all carry address, data and control signals for registers 150. During normal operation of flash memory 130, switch 180 is set so that bus 195 is coupled to bus 155 thereby permitting internal processor 140 to be coupled to registers 150. When an open trap door command is issued by processor 100 to interface unit 160 over system bus 110, interface unit 160 opens a "trap door" by setting switch 180 to couple bus 155 to bus 185. This trap door feature permits processor 100 to monitor the status of registers 150, or to set or reset registers 150 directly. Therefore, processor 100 can take control of registers 150 and thereby simulate the execution of algorithms by internal processor 140. In this way processor 100 can control hardware events occurring within flash memory 130. If internal processor 140 is running when the trap door is open, processor 100 can monitor the progress of algorithms executing in internal processor 140.

The trap door provides observability within flash memory 130 and is extremely helpful when debugging flash memory 130 as it is being designed and implemented. In one embodiment, processor 100 is also able to close the trap door. When the trap door is closed, it causes interface unit 160 to return the setting of switch 180 to the state where internal processor 140 is once again coupled directly to registers 150.

Figure 2:
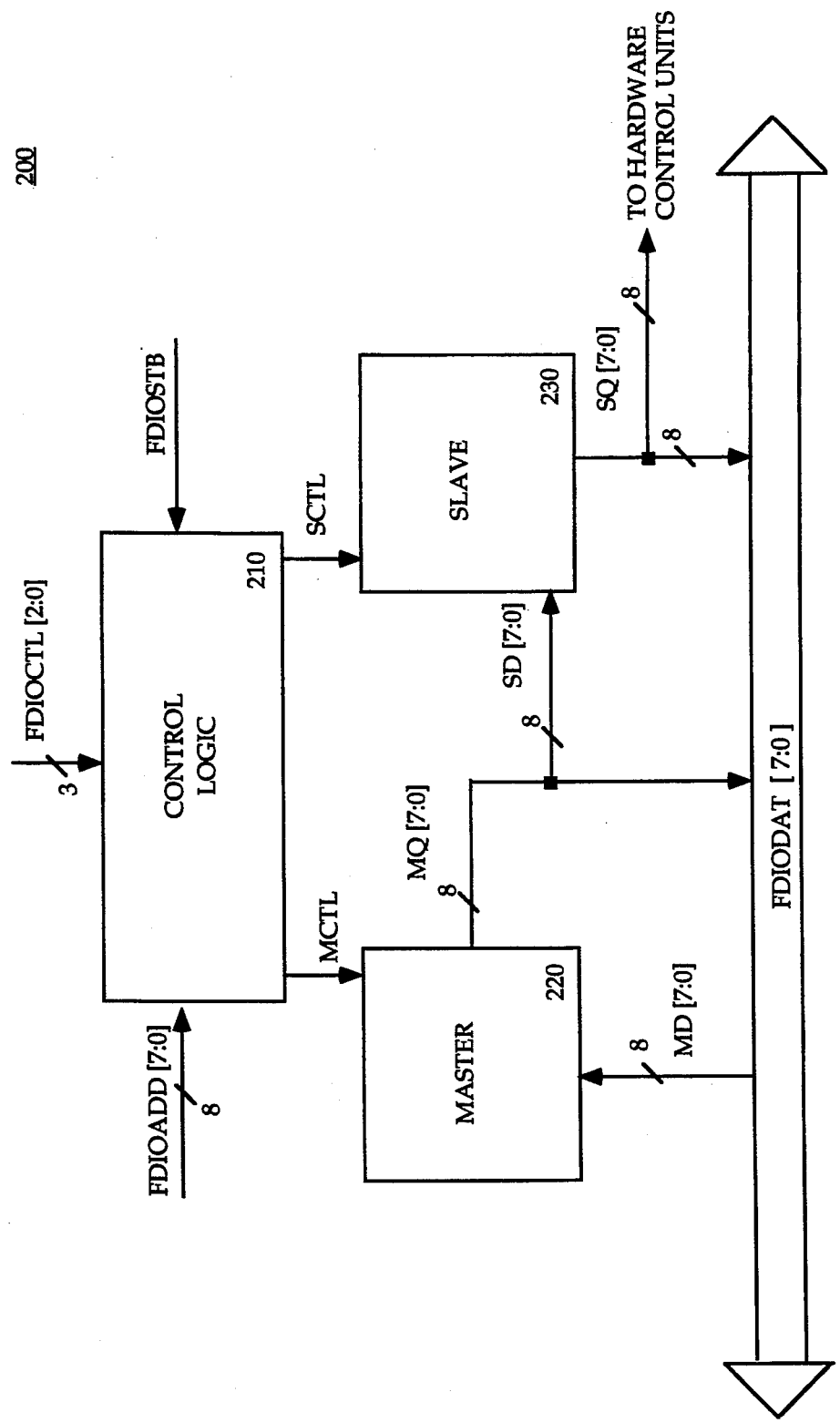
FIG. 2 illustrates a master/slave internal register of the type that may be controlled externally by the present invention.

Referring now to FIG. 2, a diagram of a representative eight bit register 200 of registers 150 is depicted. In this embodiment, each addressable register is eight bits wide and composed of an eight bit master register 220, an eight bit slave register 230 and control logic 210. Each register of registers 150, such as register 200, is coupled to address, data and control lines that together form bus 155. The data line FDIODAT [7:0] is coupled to eight bit master register 220 and to eight bit slave register 230. FDIOADD [7:0] is an eight bit address bus and is coupled to control logic 210. Because address bus FDIOADD [7:0] is eight bits wide, up to 256 individual eight bit registers, such as register 200, may be addressed within registers 150. The control signals FDIOCTL [2:0] and FDIOSTB are also provided as input to control logic 210. FDIOCTL [2:0] is a three bit control signal used to provide one of up to eight commands to control logic 210 when control logic 210 has been selected by asserting the address of the register over address bus FDIOADD [7:0]. Control logic 210 is coupled to master register 220 by control bus MCTL and to slave register 230 by control SCTL.

In one embodiment, master register 220 is an eight bit wide D-type flip flop. The input to master register 220 is an eight bit signal MD [7:0] that is coupled to bus FDIODAT [7:0]. The output of master 220 is an eight bit signal MQ [7:0] that is also coupled to bus FDIODAT [7:0] and provided as input signal SD [7:0] to slave register 230. The output of slave register 230 is signal SQ [7:0] that is provided as input to bus FDIODAT [7:0] and also coupled to hardware control units to control specific hardware events within the flash memory.

Because data bus FDIODAT [7:0] is only eight bits wide, it is only possible to set eight bits within registers 150 at any given time. Furthermore, the eight bits to be set must all be part of the same eight bit wide register. When algorithms execute within the internal processor, it frequently becomes necessary to control more than eight individual hardware events at a single time, or to control two or more hardware events that are controlled by bits within different eight bit wide registers of registers 150. Therefore, in this embodiment, each register of register 150 has been implemented as a master/slave register. In this way, the desired register state for all registers 150 may be set in the master register of each register on a register-by-register basis. Then, when each master register has been set to a desired state, a global command is issued over command line FDIOCTL [2:0] that causes every register to write the contents from the master register to the slave register. The following table sets forth the eight commands that may be given to control logic of a register over control bus FDIOCTL [2:0] in one embodiment.

| Register Functions | FDIOCTL[2:0] | FDIOADD[7:0] Addr. Required | FDIOSTB, Strobe Req. | FDIODAT[7:0] Data Required | Register Selection |
|---|---|---|---|---|---|
| Read Master | 000 | YES | NO | Driven from Register | Individual |
| Read Slave | 001 | YES | NO | Driven from Register | Individual |
| Reset Master | 010 | NO | YES | NO | Global |
| Reset Slave | 011 | NO | YES | NO | Global |
| Reset Both | 100 | NO | YES | NO | Global |
| Load Master | 101 | YES | YES | YES from Processor | Individual |
| Transfer Master to Slave (Global) | 110 | NO | YES | NO | Global |
| Load and Transfer (Individual) | 111 | YES | YES | YES from Processor | Individual |

Figure 3:
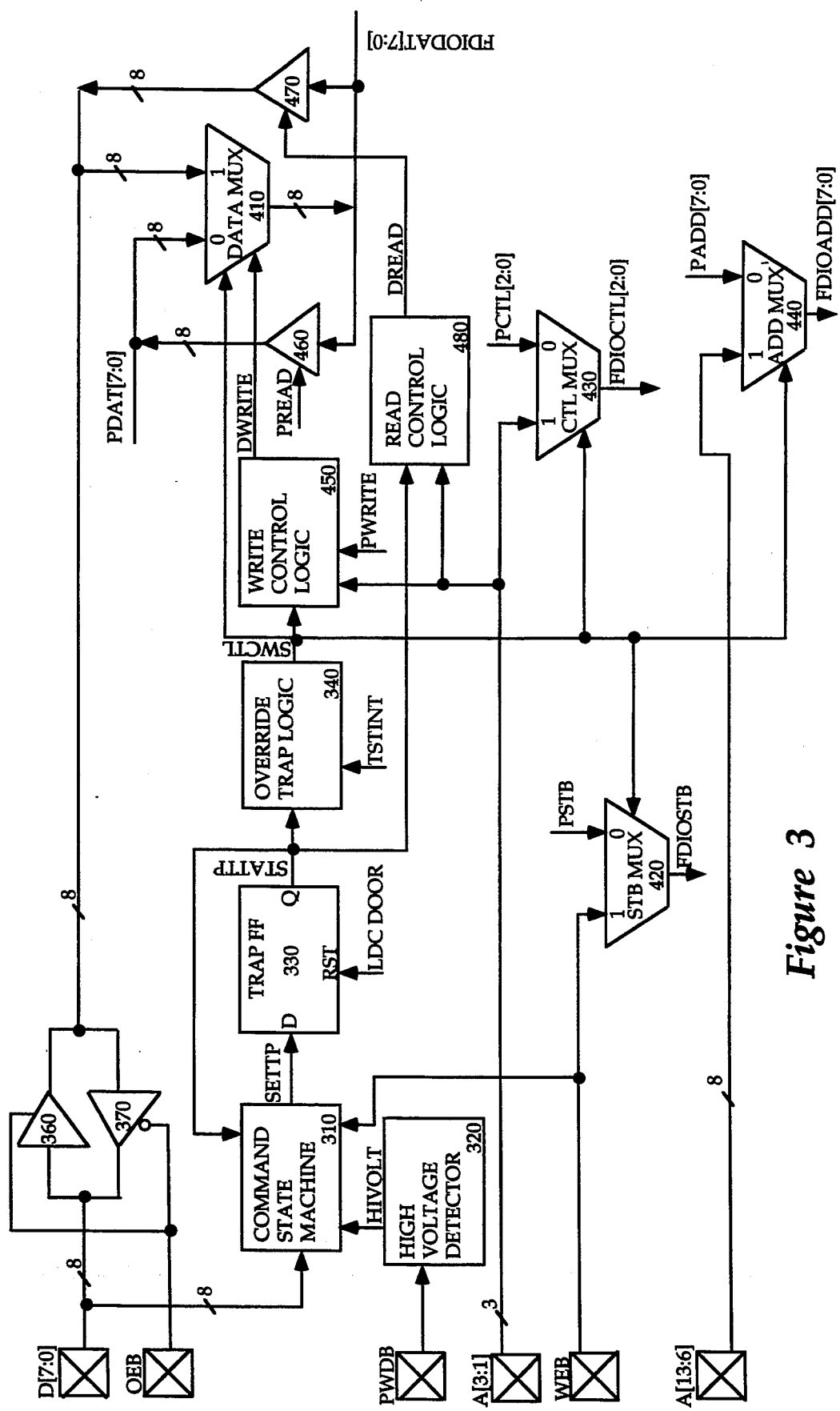
FIG. 3 illustrates switching logic and pertinent parts of an interface unit employed in one embodiment of the present invention.

Referring now to FIG. 3, a block diagram of one embodiment is depicted. In FIG. 3, data, strobe, control and address multiplexors 410, 420, 430 and 440, respectively, as well as tri-statable buffers 460 and 470, together comprise switch 180 of FIG. 1. Command state machine 310, high voltage detector 320, trap flip flop 330, override trap logic 340, write control logic 450, read control logic 480 and tristateable buffers 360 and 370 together comprise the pertinent part of interface unit 160 of FIG. 1. Signal lines FDIODAT [7:0], FDIOADD [7:0], FDIOCTL [2:0] and FDIOSTB together comprise bus 155 of FIG. 1. Similarly, signal lines PDAT [7:0], PADD [7:0], PCTL [2:0], PSTB and PREAD together comprise bus 195.

Pins D [7:0], OEB, PWDB, WEB and A [13:6, 3:1] are a subset of the pins of flash memory 130 and are used to couple system bus 110 to interface unit 160 of FIG. 1. The signals from pins D [7:0], WEB and A [13:6, 3:1], as well as control signals DWRITE, DREAD and SWCTL, together form bus 185 of FIG. 1. Finally, signals TSTINT and PWRITE are signal lines of bus 165 of FIG. 1.

In the embodiment depicted in FIG. 3, pins D [7:0] are used during the normal functioning of the flash memory chip to carry the low order byte of a 16 bit data path when reading data from, or writing data to, the flash memory chip. Pin OEB is coupled to eight bit tri-stateable buffer 360 and also inverted and coupled to eight bit tri-stateable buffer 370. Thus, by asserting or not asserting signal OUTPUT ENABLE BAR on pin OEB, the direction of data flow through tri-stateable buffers 360 and 370 can be controlled depending upon whether data is being read from, or written to, flash memory 130.

In this embodiment, data pins D [7:0] are also used to provide an eight bit command to command state machine 310. One of the eight bit commands that can be input to command state machine 310 through pins D [7:0] is an open trap door command. In this embodiment, it is desirable to only permit the trap door to be opened during manufacturer testing of the flash memory chip. This is accomplished by high voltage detector 320.

Pin PWDB normally carries the signal POWER DOWN BAR that indicates to the flash memory chip that it is to power down. In the embodiment depicted in FIG. 3, however, pin PWDB is also coupled to high voltage detector 320. The output of high voltage detector 320 is provided as an input to command state machine 310 as signal HIVOLT. When a voltage substantially higher than the normal operating voltage of the flash memory chip is asserted on pin PWDB, high voltage detector 320 asserts signal HIVOLT. Command state machine 310 is implemented so that the open trap door command will only be considered by command state machine 310 to be a valid command when signal HIVOLT is asserted. Thus, because a high voltage will not be provided to pin PWDB in a normal (i.e. non-testing) installation of flash memory 130, the open trap door command will usually be ignored. It is only during testing of flash memory chip 130, where a high voltage is supplied to pin PWDB, that the trap door can be opened to provide external tester control of flash memory 130.

In FIG. 3 it can be seen that pin WEB is also coupled to command state machine 310 and provides signal WRITE ENABLE BAR to command state machine 310. Signal WRITE ENABLE BAR is used to notify the command state machine 310 that a command has been placed on data pins D [7:0]. When the open trap command is asserted on pins D [7:0] and signals H/VOLT and WEB are asserted, command state machine 310 detects a valid open trap door command and asserts signal SETTP into one bit D-type trap flip flop 330 thereby opening the trap door.

When the trap door is open, trap flip flop 330 asserts signal STATTP to indicate the open status of the trap door. Signal STATTP is provided as an input to override trap logic 340. Signal TSTINT, tester interrupt, is also provided as an input to override trap logic 340.

When signal TSTINT is not asserted and signal STATTP is asserted, override trap logic 340 asserts signal SWCTL. Signal SWCTL, is a switch control signal, that is provided as a control input to data, strobe, control, and address multiplexors 410, 420, 430 and 440, respectively. Signal SWCTL is also provided as an input to write control logic 450.

The normal operating state that occurs when the trap door is closed is that signal SWCTL is not asserted. When signal SWCTL is not asserted, multiplexors 410, 420, 430 and 440 are set to couple the data, address and control lines of the internal processor of the flash memory to the internal registers. Specifically, control multiplexor 430 is a three bit wide multiplexor that couples signal lines PCTL [2:0] to signal lines FDIOCTL [2:0] when the trap door is closed. Address multiplexor 440 is an eight bit multiplexor that couples processor address signal lines PADD [7:0] to internal register address signal lines FDIOADD [7:0] when the trap door is closed. Multiplexor STB MUX 420, is a one bit wide multiplexor that couples processor strobe clock signal line PSTB to internal register clock signal line FDIOSTB when the trap door is closed. Finally, data multiplexor 410 is an eight bit wide multiplexor that couples processor data signal lines PDAT [7:0] to internal register data signal lines FDIODAT [7:0] when the trap door is closed.

In this embodiment, processor data signal lines PDAT[7:0] are also coupled to the output of eight bit tri-statable buffer 460. Signal PREAD is asserted by the internal processor when it needs to read data from the registers. Thus, assertion of signal PREAD causes data on FDIODAT[7:0] to be driven to the processor along processor data signal lines PDAT[7:0].

When the trap door is open, and signal TSTINT is not asserted, override trap logic 340 asserts signal SWCTL causing the multiplexors to couple the internal register data, address and control signal lines to the interface unit so that signals on the lines may be monitored and controlled externally from the flash memory chip. Specifically, when the trap door is open, data pins D [7:0] are coupled to internal register data signal lines FDIODAT [7:0] by data multiplexor 410. Strobe multiplexor 420 couples pin WEB to internal register clock strobe signal line FDIOSTB when the trap door is open. In this way, signal WRITE ENABLE BAR can be asserted and deasserted when the trap door is open and thereby simulate the internal clock signal that would normally be provided by the internal processor over signal line PSTB when the trap door is closed.

In the embodiment depicted in FIG. 3, the flash memory has a 21 bit address space. Therefore, when the trap door is closed, 21 address pins are used to specify flash memory words to be read from, or written to, the flash memory. When the trap door is open, however, the address pins are not used to access the flash memory. Therefore, when the trap door is open, three of the address pins are used to provide a three bit control signal to the internal registers and eight of the address pins are used to provide an internal address signal to the internal registers. In FIG. 3, it can be seen that when the trap door is open, address pins A [3:1] are coupled by control multiplexor 430 to internal register control signal lines FDIOCTL [2:0]. In a similar manner, address pins A [13:6] are coupled by address multiplexor 440 to internal register address signal lines FDIOADD [7:0] when the trap door is open.

Referring again to override trap logic 340, occasionally when the trap door is open, the internal processor of the flash memory chip will need to access registers 150 while executing an algorithm. When this happens, the processor can override the open trap door state by asserting interrupt signal TSTINT. When override trap logic 340 senses that signal TSTINT has been asserted, override trap logic 340 will cause signal SWCTL to not be asserted regardless of whether or not the trap door is open. In this way, the internal processor of the flash memory chip can regain access to the internal registers when the trap door is open.

In the embodiment depicted in FIG. 3, signal SWCTL of override trap logic 340 is also provided as an input to write control logic circuitry 450. Write control logic 450 is coupled to data multiplexor 410 by output signal line DWRITE. Write control logic 450 is also coupled to address pins A [3:1] and to the internal processor by processor control line PWRITE. Signal PWRITE is asserted by the internal processor when it has data to write to the registers. Write control logic 450 generates signal DWRITE to drive the data multiplexor 410 output onto FDIODAT[7:0].

Similarly, in the embodiment depicted in FIG. 3, signal STATTP of trap flip flop 330 is provided as an input to read control logic circuitry 480. Read control logic 480 is coupled to eight bit tri-statable buffer 470 by output signal line DREAD. Read control logic 480 is also coupled to address pins A [3:1]. Read control logic 480 generates signal DREAD when the trap door is open (i.e., STATTP asserted) to drive data on FDIODAT[7:0] towards data pins D[7:0] if A[3:1] designate "READ MASTER" or "READ SLAVE". In this way, when the trap door is open and the internal processor is executing an algorithm, the external tester can monitor the internal data signals sent between the internal microprocessor and internal registers.

It is desirable to be able to close the trap door and thereby restore control of the internal registers to the internal processor of the flash memory chip. When the trap door is open, one cannot close the trap door simply by issuing a close trap door command to command state machine 310 over data pins D [7:0]. This is because data pins D [7:0] are used to read data from, and write data to, the internal registers when the trap door is open. Therefore, command state machine 310 is set to ignore any signals asserted on data pins D [7:0] when the trap door is open to prevent random data patterns from being interpreted by command state machine 310 as being valid commands. In FIG. 3, it can be seen that signal STATTP is provided as an input to command state machine 310. When the trap door is open, signal STATTP is asserted causing command state machine 310 to ignore any signals placed on data pins D [7:0]. When the trap door is closed, signal STATTP is not asserted, and command state machine 310 monitors data pins D [7:0] for valid commands.

Referring again to trap flip flop 330, the flip flop can be reset by asserting signal LDC DOOR. When signal LDC DOOR is asserted, trap flip flop 330 is reset and signal STATTP is no longer asserted. Signal LDC DOOR is one of the signals output from a slave register of one of the eight bit wide master/slave registers of the internal registers of the flash memory chip.

Referring again to FIG. 2, if bit 0 of register 200 is used to provide signal LDC DOOR, the trap door can be closed as follows. First, register 200 is addressed by asserting the address of register 200 on address line FDIOADD [7:0]. At the same time, a data pattern having signal line FDIODAT [0] asserted would be provided to the data bus and the "LOAD AND TRANSFER" command would be given to control logic 210 by asserting signal lines FDIOCTL [2:0] appropriately. When the FDIOSTB signal was asserted, control logic 210 would sense that it was being addressed. It would also sense that it was to load master register 220 with the values asserted on data signal lines FDIODAT [7:0] and also transfer these values to slave register 230. Note that because line FDIODAT [0] was asserted, signal line SQ [0] would be asserted by slave 230.

Referring again to FIG. 3, because signal line SQ [0] of FIG. 2 is the same as the signal line carrying signal LDC DOOR, signal LDC DOOR would be asserted causing trap flip flop 330 to be reset and signal STATTP would no longer be asserted. This would cause command state machine 310 to return to monitoring pins D [7:0] for commands. This would also cause override trap logic 340 to no longer assert signal SWCTL. Therefore, data, strobe, control and address multiplexors 410, 420, 430 and 440, respectively, would switch so that the on-board microprocessor was once again coupled to the internal registers. In this way, the trap door can be closed so that an external tester can relinquish control of the internal registers and restore normal functionality to the flash memory chip.

Thus, the above-described embodiment implements external tester control architecture and circuitry in a flash memory that includes an internal, programmable processor. As such, the above-described embodiment permits debugging of the flash memory integrated circuit as it is being designed and implemented.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than restrictive sense.

What is claimed is:

1. A testing apparatus for testing a unit, the testing apparatus comprising:
   an external processor disposed external to the unit;
   an internal processor disposed on the unit, the internal processor programmed so that the internal processor can execute an algorithm, the algorithm performing an operation on the unit if the algorithm is executed;
   an internal bus disposed on the unit;
   a register for storing a state datum, the register disposed on the unit and coupled to the processor by the internal bus, the internal bus used by the internal processor to access the state datum if the processor is executing the algorithm;
   an interface disposed on the unit and coupled to the internal and external processors, the interface for receiving a plurality of commands from the external processor, the commands comprising an internal processor command and an open trap command, if issued, the internal processor command causing the internal processor to execute the algorithm; and a switch disposed on the unit, the switch coupled to the interface and coupled between the internal processor and the internal bus, the switch permitting the external processor to access the state datum of the register if the interface receives the open trap command.

2. The testing apparatus as set forth in claim 1 wherein if the interface receives the open trap command, the switch permits the external processor to use the internal bus to access the state datum of the register.

3. The testing apparatus as set forth in claim 1 wherein the unit is a memory unit comprising a memory array comprised of a plurality of memory cells, the internal processor coupled to the memory array, the internal processor programmed so that if the algorithm is executed, the algorithm will perform an operation on at least one of the memory cells.

4. The testing apparatus as set forth in claim 3 wherein the memory array is non-volatile memory.

5. The testing apparatus as set forth in claim 1 wherein there are a plurality of the registers for storing a plurality of the state data.

6. The testing apparatus as set forth in claim 1 wherein there are a plurality of algorithms that the internal processor can execute and a corresponding plurality of internal processor commands to invoke execution of the algorithms.

7. The testing apparatus as set forth in claim 1 wherein:
there are a plurality of the registers for storing a plurality of the state data;
the apparatus further comprises a trap state flip flop coupled to the interface and to the switch, if the interface receives the open trap command, the interface sets the trap state flip flop, the setting of the trap state flip flop causes the switch to permit the external processor to access the plurality of registers; and
wherein one of the registers of the plurality of registers is a trap state register storing a trap state datum, the trap state datum having a value of trap open or a value of trap closed, the trap state register coupled to the trap state flip flop such that the trap state datum has a value of trap open if the trap state flip flop is set and such that the external processor can access the trap state register if the trap state flip flop is set to set the trap state register to the trap closed value, setting the trap state register to the trap closed value causes the trap state flip flop to reset, resetting the trap state flip flop causes the switch to no longer permit the external processor to access the registers.

8. The testing apparatus as set forth in claim 1 wherein the interface comprises a command state machine.

9. The testing apparatus as set forth in claim 1 wherein there are a plurality of the registers for storing a plurality of the state data and wherein one of the registers is a trap state register storing a trap state datum, the trap state datum having a value of trap open or a value of trap closed, the trap state register coupled to the interface and the switch such that the trap state datum has a value of trap open if the switch permits the external processor to access the registers, and such that the external processor can access the trap state register if the trap state datum has a value of trap open and set the trap state register to the trap closed value thereby causing the switch to no longer permit the external processor to access the registers.

10. The testing apparatus as set forth in claim 1 wherein the internal processor cannot access the register if the switch is set to permit the external processor to access the register and further including interrupt circuitry coupled to the switch and the internal processor such that if the internal processor executes the algorithm, and the switch is set to permit the external processor to access the register, an interrupt occurs causing the interrupt circuitry to set the switch so that the internal processor can access the register and the external processor cannot access the register.

11. The testing apparatus as set forth in claim 10 wherein if the interrupt has occurred and the internal processor completes access to the register, the interrupt circuitry sets the switch so that the external processor can access the register and the internal processor cannot access the register.

12. The testing apparatus as set forth in claim 1 wherein the internal processor cannot access the register if the switch is set to permit the external processor to access the register and further including interrupt circuitry coupled to the switch and the internal processor such that if the internal processor executes the algorithm and the switch is set to permit the external processor to access the register, an interrupt occurs causing the interrupt circuitry to set the switch so that the internal processor can access the register and the external processor can monitor the bus.

13. The testing apparatus as set forth in claim 12 wherein if the interrupt has occurred and the internal processor completes access to the register, the interrupt circuitry sets the switch so that the external processor can access the register and the internal processor cannot access the register.

14. The testing apparatus as set forth in claim 1 wherein the interface only accepts the open trap command if the external processor applies an accept command signal to the interface.

15. The testing apparatus as set forth in claim 14 wherein the unit has an associated operational voltage level equal to a first voltage and the accept command signal has an associated signal voltage level equal to a second voltage, the second voltage being substantially higher than the first voltage.

16. A unit comprising:
a processor programmed so that the processor can execute an algorithm, if executed, the algorithm performing an operation on the unit;
an internal bus;
a register for storing a state datum, the register coupled to the processor by the internal bus, the internal bus used by the processor to access the state datum if the processor is executing the algorithm;
an interface coupled to the processor and to a source external to the unit, the interface for receiving a plurality of commands from the external source, the commands comprising a processor command and an open trap command, the processor command causing the processor to execute the algorithm; and
a switch coupled to the interface and coupled between the processor and the internal bus, the switch permitting the external source to access the state datum of the register if the interface receives the open trap command.

17. The unit as set forth in claim 16 wherein if the interface receives the open trap command, the switch permits the external source to use the internal bus to access the state datum of the register.

18. The unit as set forth in claim 16 wherein the unit is a memory unit, the memory unit further comprising a plurality of memory cells, the plurality of cells forming a memory array, the processor being coupled to the memory array, if the processor executes the algorithm, the processor performing the operation on at least one of the memory cells.

19. The unit as set forth in claim 18 wherein the memory array is non-volatile memory.

20. The unit as set forth in claim 16 wherein there are a plurality of the registers for storing a plurality of the state data.

21. The unit as set forth in claim 16 wherein there are a plurality of algorithms that the processor can execute and a corresponding plurality of processor commands to invoke execution of the algorithms.

22. The unit as set forth in claim 16 wherein:
there are a plurality of the registers for storing a plurality of the state data;
the unit further comprises a trap state flip flop coupled to the interface and to the switch, if the interface receives the open trap command, the interface sets the trap state flip flop, the setting of the trap state flip flop causes the switch to permit the external source to access the plurality of registers; and
wherein one of the registers of the plurality of registers is a trap state register storing a trap state datum, the trap state datum having a value of trap open or a value of trap closed, the trap state register coupled to the trap state flip flop such that the trap state datum has a value of trap open if the trap state flip flop is set and such that the external source can access the trap state register if the trap state flip flop is set to set the trap state register to the trap closed value, setting the trap state register to the trap closed value causes the trap state flip flop to reset, resetting the trap state flip flop causes the switch to no longer permit the external source to access the registers.

23. The unit as set forth in claim 16 wherein the interface comprises a command state machine.

24. The unit as set forth in claim 16 wherein there are a plurality of the registers for storing a plurality of the state data and wherein one of the registers is a trap state register storing a trap state datum, the trap state datum having a value of trap open or a value of trap closed, the trap state register coupled to the interface and the switch such that the trap state datum has a value of trap open if the switch permits the external source to access the registers, and such that the external source can access the trap state register if the trap state datum has a value of trap open and set the trap state register to the trap closed value thereby causing the switch to no longer permit the external source to access the registers.

25. The unit as set forth in claim 16 wherein the processor cannot access the register if the switch is set to permit the external source to access the register and further including interrupt circuitry coupled to the switch and the processor such that if the processor executes the algorithm, and the switch is set to permit the external source to access the register, an interrupt occurs causing the interrupt circuitry to set the switch so that the processor can access the register and the external source cannot access the register.

26. The unit as set forth in claim 25 wherein if the interrupt has occurred and the processor completes access to the register, the interrupt circuitry sets the switch so that the external source can access the register and the processor cannot access the register.

27. The unit as set forth in claim 16 wherein the processor cannot access the register if the switch is set to permit the external source to access the register and further including interrupt circuitry coupled to the switch and the processor such that if the processor executes the algorithm and the switch is set to permit the external source to access the register, an interrupt occurs causing the interrupt circuitry to set the switch so that the processor can access the register and the external source can monitor the bus.

28. The unit as set forth in claim 27 wherein if the interrupt has occurred and the processor completes access to the register, the interrupt circuitry sets the switch so that the external source can access the register and the processor cannot access the register.

29. The unit as set forth in claim 16 wherein the interface only accepts the open trap command if the external source applies an accept command signal to the interface.

30. The memory unit as set forth in claim 29 wherein the unit has an associated operational voltage level equal to a first voltage and the accept command signal has an associated signal voltage level equal to a second voltage, the second voltage being substantially higher than the first voltage.

31. A unit comprising:
processor circuitry for executing an algorithm, the processor circuitry programmed so that the processor can execute the algorithm, if executed the algorithm performing an operation on the unit;
internal bus circuitry for transferring signals;
register circuitry for storing a state datum, the register circuitry coupled to the processor circuitry by the internal bus circuitry, the internal bus circuitry used by the processor circuitry to access the state datum if the processor circuitry is executing the algorithm;
interface circuitry coupled to the processor circuitry and to a source external to the unit, the interface circuitry for receiving a plurality of commands from the external source, the commands comprising a processor command and an open trap command, the processor command causing the processor circuitry to execute the algorithm; and
switching circuitry coupled to the interface circuitry and coupled between the processor circuitry and the internal bus circuitry, the switching circuitry for permitting the external source to access the state datum of the register if the interface circuitry receives the open trap command.

32. A method of testing a unit, the unit comprising an interface, a switch and a processor coupled to a register by an internal bus, the processor programmed so that the processor will execute an algorithm, if executed, the algorithm performing an operation on the unit, the register for storing a state datum, the internal bus used by the processor to access the state datum if the processor is executing the algorithm, the interface coupled to the processor and to a source external to the unit, the interface for receiving a plurality of commands from the external source, the commands comprising a processor command and an open trap command, the processor command causing the processor to execute the algorithm, the switch coupled to the interface and coupled between the processor and the internal bus, the switch permitting the external source to access the state datum of the register if the interface receives the open trap command, the test method comprising the steps of:

the external source issuing the open trap command to the interface;

upon sensing the open trap command, the interface causing the switch to permit the external source to access the datum; and the external source testing the unit by accessing the datum.

33. The method as set forth in claim 32 wherein there are a plurality of the registers for storing a plurality of the state data, the method further comprising the steps of:

upon sensing the open trap command, the interface causing a trap state register to store a trap state value of trap open, the trap state register being one of the registers;

the external source accessing the trap state register when the trap state datum has a value of trap open and setting the trap state register to a value of trap closed thereby causing the switch to no longer permit the external processor to access the registers.

34. The method as set forth in claim 32 wherein there are a plurality of the registers for storing a plurality of the state data, the unit further comprises, the method further comprising the steps of:

upon sensing the open trap command, the interface setting a trap state flip flop, the trap state flip flop coupled to the interface and to the switch;

upon setting, the trap state flip flop causing the switch to permit the external source to access the datum;

a trap state register storing a trap state value of trap open if the trap state flip flop is set, the trap state register being one of the registers;

the external source accessing the trap state register and setting the trap state register to a value of trap closed;

upon being set to the value of trap closed, the trap state register causing the trap state flip flop to reset;

upon resetting, the trap state flip flop causing the switch to no longer permit the external processor to access the registers.

* * * * *

UNITED STATES PATENT AND TRADEMARK OFFICE
CERTIFICATE OF CORRECTION

PATENT NO.   :   5,410,544
DATED        :   April 25, 1995
INVENTOR(S)  :   Kreifels et al.

It is certified that error appears in the above-identified patent and that said Letters Patent is hereby corrected as shown below:

In column 6 at line 1 delete "H/VOLT" and insert --HIVOLT--

Signed and Sealed this

Twenty-second Day of October, 1996

Attest:

BRUCE LEHMAN

Attesting Officer   Commissioner of Patents and Trademarks